(12) United States Patent
Lützen et al.

(10) Patent No.: US 6,939,805 B2
(45) Date of Patent: Sep. 6, 2005

(54) METHOD OF ETCHING A LAYER IN A TRENCH AND METHOD OF FABRICATING A TRENCH CAPACITOR

(75) Inventors: Jörn Lützen, Dresden (DE); Barbara Schmidt, Dresden (DE); Stefan Rongen, Dresden (DE); Martin Schrems, Eggersdorf B. Graz (AT); Daniel Köhler, Dresden (DE)

(73) Assignee: Infineon Technologies AG, Munich (DE)

( * ) Notice: Subject to any disclaimer, the term of this patent is extended or adjusted under 35 U.S.C. 154(b) by 234 days.

(21) Appl. No.: 10/253,196

(22) Filed: Sep. 24, 2002

(65) Prior Publication Data

US 2003/0064591 A1 Apr. 3, 2003

(30) Foreign Application Priority Data

Sep. 24, 2001 (DE) .......................................... 101 46 888

(51) Int. Cl.[7] .................. H01L 21/302; H01L 21/3065; C09K 13/00
(52) U.S. Cl. ...................... 438/700; 438/703; 438/706; 438/723; 252/79.1
(58) Field of Search ................................ 438/700, 703, 438/706, 723, 710; 252/79.1

(56) References Cited

U.S. PATENT DOCUMENTS

| | | | |
|---|---|---|---|
| 5,407,534 A | * | 4/1995 | Thakur ........................ 438/398 |
| 5,587,870 A | * | 12/1996 | Anderson et al. ............ 361/313 |
| 5,877,061 A | * | 3/1999 | Halle et al. .................. 438/386 |
| 6,162,732 A | * | 12/2000 | Lin et al. ..................... 438/705 |
| 6,190,993 B1 | * | 2/2001 | Seo et al. ..................... 438/398 |
| 6,635,185 B2 | * | 10/2003 | Demmin et al. .............. 216/64 |
| 2002/0110970 A1 | * | 8/2002 | Tsao ........................... 438/200 |

FOREIGN PATENT DOCUMENTS

| | | | | |
|---|---|---|---|---|
| DE | 199 47 053 C1 | | 5/2001 | |
| DE | 10053461 A1 | * | 5/2002 | ....... H01L/21/8242 |
| JP | 4261017 A | * | 9/1992 | ......... H01L/21/302 |

OTHER PUBLICATIONS

Otani et al., Fabrication of Thin Film Transistor Array Substrate, Sep. 17, 1992, English Abstract of JP 4261017 A, 2 pages.*

Toebben et al., Production of a trench capacitor used in DRAM storage cells includes forming a trench in a substrate using a mask, forming an insulating collar, and growing hemispherical silicon grains in trench, May 16, 2002.*

* cited by examiner

Primary Examiner—Nadine G. Norton
Assistant Examiner—Lynette T. Umez-Eronini
(74) Attorney, Agent, or Firm—Laurence A. Greenburg; Werner H. Stemer; Ralph E. Locher

(57) ABSTRACT

To fabricate a trench capacitor in a substrate, a trench is formed in the substrate. The trench has an upper region and a lower region. In the trench, first of all nanocrystallites and/or a seed layer for nanocrystallites are deposited in the upper region and the lower region. Then, the nanocrystallites and/or the seed layer are removed from the upper region of the trench by means of an etching process. The etching parameters of the etching process are selected in such a way that the seed layer and/or the nanocrystallites which are uncovered in the upper region and the lower region are removed only from the upper region. Consequently, an expensive mask layer can be avoided in the lower region of the trench.

20 Claims, 6 Drawing Sheets

METHOD OF ETCHING A LAYER IN A TRENCH AND METHOD OF FABRICATING A TRENCH CAPACITOR

BACKGROUND OF THE INVENTION

Field of the Invention

The present patent application relates to a method for etching a layer in a trench and to methods for fabricating a trench capacitor. The trench capacitor is particularly suitable for a memory cell of a semiconductor memory.

Semiconductor memories, such as for example DRAMs (dynamic random access memories) comprise a cell array and driving peripherals. The cell array contains a multiplicity of individual memory cells.

The cell array of a DRAM chip includes a matrix of memory cells which are arranged in the form of rows and columns and are driven by word lines and bit lines. The reading of data from the memory cells or the writing of data to the memory cells is effected by the activation of suitable word lines and bit lines.

A memory cell of a DRAM usually includes a transistor which is connected to a capacitor. The transistor comprises two doping regions which are separated from one another by a channel, which is controlled by a gate. One doping region is referred to as a drain region, and the other doping region is referred to as a source region. One of the diffusion regions is connected to a bit line, the other diffusion region is connected to a capacitor and the gate is connected to a word line. When a memory cell is accessed, the transistor is made conductive by application of suitable voltages to the gate, and the capacitor is connected to the bit line via the transistor.

The on-going miniaturization of memory components has led to a continuous increase in the integration density. The result of the continuous increase in the integration density is that the surface area available for each memory cell is becoming ever smaller. This means that the select transistor and the storage capacitor of a memory cell are subject to a constant reduction in their geometric dimensions.

The on-going efforts to reduce the size of the memory devices promotes the designing of DRAMs with a high density and smaller feature size in order to achieve a smaller memory-cell area. Smaller components, such as for example capacitors, are used to fabricate memory cells which require a small surface area. However, the use of small capacitors results in a lower storage capacitance in the individual capacitor, which in turn may have an adverse effect on the functionality and usability of the memory device.

By way of example, read amplifiers require a sufficient signal level to reliably read the information item which is stored in the memory cells. The ratio of the storage capacitance to the bit line capacitance is crucial in the determination of the signal level. If the storage capacitance is too low, this ratio may be too low to generate a sufficient signal to drive the read amplifier. Also, a lower storage capacitance requires a higher refresh frequency.

By way of example, HSG (hemispherical silicon grains) are known to increase the storage capacitance. An etching mask is usually required in order to structure these grains and in general terms to structure a material with the aid of a dry-etching process, this mask ensuring that the material below the etching mask is locally retained while the material in the areas which are not protected by the etching mask is removed. The removal of nanocrystallites, such as for example HSG (hemispherical silicon grains), from the upper region of a trench capacitor of a DRAM represents a special case in connection with this general problem. The HSG is usually removed from the region of the insulation collar, in order, for example, to avoid a short circuit between the buried outer capacitor electrode and the inner capacitor electrode.

For this purpose, by way of example, photoresist or polycrystalline silicon could be introduced into the lower region of the trench, in order to protect the trench sidewall and the HSG already present thereon. Therefore, the HSG can be removed from the upper region of the trench. However, a drawback in this case is that a considerable process outlay is required, for example the introduction and patterning of the protective layer and the subsequent removal of the protective layer from the lower region of the trench.

Commonly assigned German patent DE 199 47 053 C1 describes a trench capacitor for use in a memory cell of a DRAM, and a corresponding fabrication method. The trench capacitor has a trench that is directed from the surface of the semiconductor substrate into the interior of the substrate and has an upper section, defined by a collar oxide, and a lower section, directed toward the interior of the substrate. A dielectric layer is deposited on the trench sidewalls of the lower section and on the collar oxide of the upper section. The dielectric layer may consist of tungsten oxide. According to one embodiment, a barrier layer may be laid beneath the dielectric layer in the upper and lower sections of the trench. The barrier layer may consist of tungsten nitride.

SUMMARY OF THE INVENTION

It is accordingly an object of the invention to provide a method of etching a layer in a trench, which overcomes the above-mentioned disadvantages of the heretofore-known devices and methods of this general type and which provides a method for removing a layer arranged in a trench from the upper region of the trench.

With the foregoing and other objects in view there is provided, in accordance with the invention, a method of etching a layer in a trench, which comprises the following method steps:

providing a substrate having a substrate surface and a trench formed therein, the trench having a trench sidewall, an upper region proximal to the substrate surface, and a lower region distal from the substrate surface;

forming a layer in the lower region and the upper region on the trench sidewall of the trench, the layer comprising a material that is different from a material of the substrate; and subjecting the layer to a dry-etching process, while the layer is exposed in the upper region and in the lower region, to partly remove the layer from the trench, and thereby setting the parameters for the dry-etching process, preferably the etching time, such that the layer is removed from the upper region of the trench but remains in place in the lower region of the trench.

In accordance with an added feature of the invention, the layer comprises silicon or a metal or an insulator.

In accordance with an additional feature of the invention, the trench has a depth and a diameter, and the ratio of the depth to the diameter is greater than 10, in particular greater than 20.

With the above and other objects in view there is also provided, in accordance with the invention, a method of fabricating a trench capacitor with nanocrystallites for increasing the storage capacitance of the trench capacitor of a memory cell of a semiconductor memory, the nanocrystallites being removed in a simplified and inexpensive way from the region of an insulation collar arranged in the trench capacitor.

The novel method is defined as a method for fabricating a trench capacitor having an inner capacitor electrode and an outer capacitor electrode, and the method comprises the following method steps:

providing a substrate having a substrate surface and a trench formed therein, the trench having a trench sidewall, an upper region proximal to the substrate surface and a lower region distal from the substrate surface;

forming a stop layer on the trench sidewall;

depositing nanocrystallites on the stop layer to form a part of the outer capacitor electrode;

subjecting the nanocrystallites to a dry-etching process, with the nanocrystallites exposed in the upper region and in the lower region of the trench, to partly remove the nanocrystallites from the trench, and thereby setting the parameters for the dry-etching process such that the nanocrystallites are removed from the upper region of the trench but remain in place in the lower region of the trench;

subsequently forming a capacitor dielectric in the trench; and at least partially filling the trench with a conductive trench filling forming the inner capacitor electrode.

A method for patterning the deposited HSG is used which can be carried out without additional masking of the lower region of the trench. For this purpose, a dry-etching process is used, the process parameters of which are set in such a way that a significant drop in the etching rate occurs with increasing depth in a structure with a high aspect ratio. The basic mechanism is based on the etching substance being consumed at the etching front. This is the case, for example, in the trench of a trench capacitor. The process parameters of the etch are set in such a way that the etch stops below the insulation collar or below the region wherein the insulation collar is subsequently applied.

In this context, it is advantageous that a reduced process outlay and a reduced process complexity are required. By way of example, there is no need to fill the lower region of the trench with a mask, and consequently the process steps required to deposit the mask, to recess the mask and to remove the mask can be dispensed with. In this context, it is advantageous that damage to the trench sidewall or the insulation collar can be avoided; such damage may occur, for example, when using possible ways of removing the mask from the lower region of the trench, which lie outside the invention. A further advantage is that the proposed etching process can be controlled evermore easily as the integration density increases and therefore as the aspect ratio of the trench capacitor (ratio between trench diameter and trench depth) increases, since the control of the etching depth by means of the selected process parameters becomes less susceptible to faults.

With the above and other objects in view there is also provided, in accordance with the invention, a method for fabricating a trench capacitor having an inner capacitor electrode and an outer capacitor electrode, comprising the steps of:

providing a substrate having a substrate surface, wherein a trench, which has a trench sidewall, an upper region and a lower region, is formed, the upper region facing the substrate surface and the lower region being remote from the substrate surface;

forming a stop layer in the lower region and the upper region of the trench, on the trench sidewall;

forming a seed layer in the lower region and the upper region of the trench, on the stop layer, the seed layer, which is uncovered in the upper region and the lower region, being removed from the trench by means of a dry-etching process before the selective deposition of nanocrystallites, the parameters for the etching process, in particular the etching time, being set in such a way that the seed layer is removed from the upper region of the trench and remains in place in the lower region of the trench;

selectively depositing the nanocrystallites as part of the outer capacitor electrode, the nanocrystallites preferably being formed on the seed layer;

forming a capacitor dielectric in the trench;

at least partially filling the trench with a conductive trench filling as inner capacitor electrode.

This inventive solution to the object also uses an etching process, the parameters of which are selected in such a way that a layer which is uncovered in the trench is removed from the upper region of the trench and remains in place in the lower region of the trench. Unlike in the first solution, however, the nanocrystallites themselves are not removed from the upper layer, but rather a seed layer, on which the nanocrystallites can be grown selectively, is initially formed in the upper region and the lower region of the trench and is then removed from the upper region of the trench by means of the etching process according to the invention, so that during a subsequent selective deposition of the nanocrystallites, the nanocrystallites are preferentially formed in the lower region of the trench, on the seed layer which has remained in place there. This variant represents a selective process.

According to an advantageous configuration of the invention, the etching process stops at the stop layer in order to protect the trench sidewall. This has the advantage that the trench sidewall, on which the nanocrystallites or the seed layer have been uncovered, is protected by means of the stop layer, and the etching stops at the stop layer, so that damage to the trench sidewall can be avoided.

According to a further configuration of the method according to the invention, an amorphous layer is deposited on the nanocrystallites. The amorphous layer consists, for example, of the same material as the nanocrystallites and, during a subsequent treatment at elevated temperature, can recrystallize together with the nanocrystallites, with the result that the density and geometry of the nanocrystallites are improved.

According to an advantageous configuration of the method according to the invention, the etching process is carried out by means of the etching gases sulfur hexafluoride $SF_6$ and nitrogen $N_2$, with a gas flow rate ratio of sulfur hexafluoride to nitrogen of between 0.1 and 1. The abovementioned range for the ratio of sulfur hexafluoride to nitrogen is particularly advantageous for carrying out the etch according to the invention, since the ratio can be used to set the etching depth. In addition, the selectivity with respect to the stop layer can be influenced in such a way that, by way of example, silicon (amorphous silicon or HSG) is etched and silicon oxide and/or silicon nitride remains in place.

If appropriate, the etching depth can also be predetermined by means of the process time.

According to a further configuration of the method according to the invention, the etching process is carried out at a pressure of between 3.9 Pa and 6.8 Pa (30–50 millitorr) in the etching chamber. The abovementioned pressure range is between 3 and 5 times greater than conventional process parameters used for etching of a bulk material.

According to a further variant of the method according to the invention, an insulation collar is formed on the trench sidewall in the upper region. The insulation collar is used, for example, in a trench capacitor of a DRAM memory cell, for insulation of the active region which includes the select transistor.

According to a further configuration of the method according to the invention, a power of between 100 watts and 400 watts is introduced into the process chamber during the etching process. The bias power which is applied to the wafer may be up to 10 watts.

In accordance with a concomitant feature of the invention, the etching process is carried out for a time of between 5 seconds and 300 seconds.

Other features which are considered as characteristic for the invention are set forth in the appended claims.

Although the invention is illustrated and described herein as embodied in a method for etching a layer in a trench and method for fabricating a trench capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
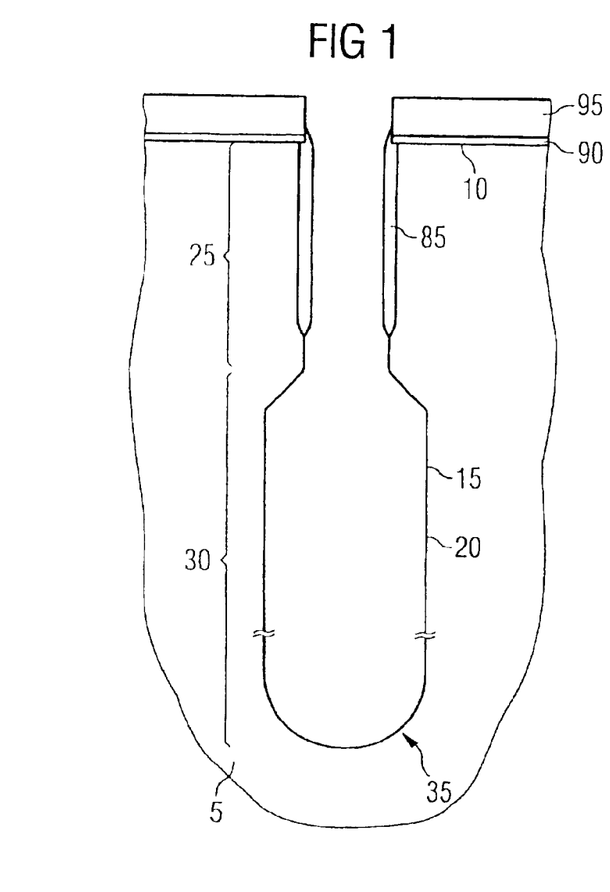
FIG. 1 is a partial sectional view taken through a substrate wherein a trench, which is suitable for accommodating a trench capacitor of a DRAM memory cell, is formed.

Referring now to the figures of the drawing in detail and first, particularly, to FIG. 1 thereof, there is shown a substrate 5 which has a substrate surface 10. A trench 15 has been formed in the substrate 5 starting from the substrate surface 10. The trench 15 has a trench sidewall 20. Furthermore, the trench 15 has an upper region 25 and a lower region 30, the upper region 25 facing the substrate surface 10 and the lower region 30 being remote from the substrate surface 10. The trench 15 is suitable for a trench capacitor 35 for a memory cell of a DRAM semiconductor memory to be formed in it. An insulation collar 85 is arranged in the upper region 25 of the trench 15. On the substrate surface 10 there is an oxide mask 90, on which there is a nitride mask 95. The substrate 5 is formed, for example, from silicon in single-crystal form. The insulation collar comprises, for example, silicon oxide or silicon nitride.

Figure 2:
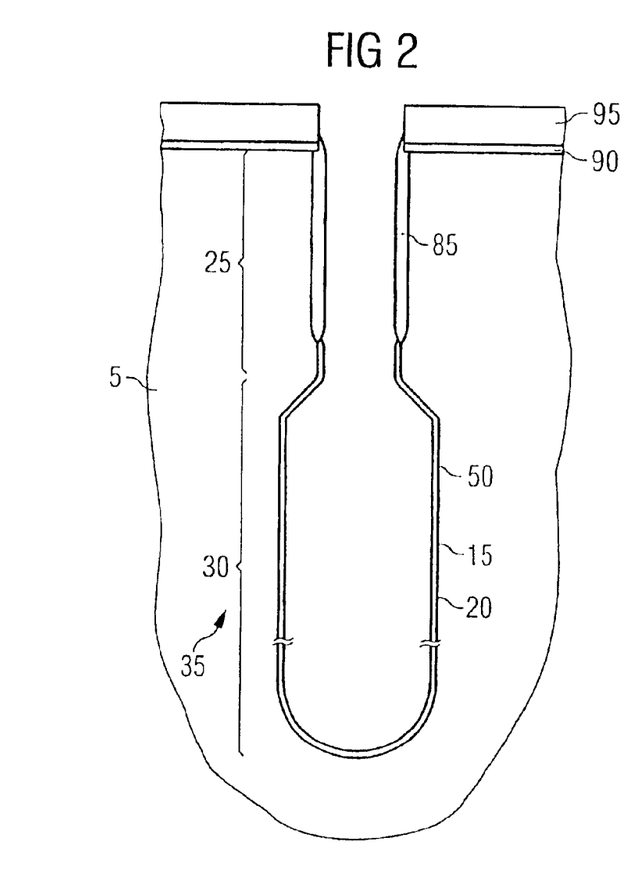
FIG. 2 is the sectional view from FIG. 1, wherein a stop layer has been formed in the trench.

Referring to FIG. 2, a stop layer 50 is formed in the trench 15 on the trench sidewall 20, at least on the silicon of the substrate. The stop layer comprises, for example, silicon oxide or silicon nitride. The stop layer may be formed, for example, by means of a furnace process, wherein nitrogen or oxygen is introduced into the process chamber and the stop layer 50 is formed by means of a thermal reaction at the trench sidewall 20. The stop layer 50 usually has a thickness of between 0.5 and 1.5 nm. This allows a tunnel contact between HSG and the surrounding substrate. Alternatively, the stop layer 50 may be deposited by means of a CVD (chemical vapor deposition) processing. We also provide for the chemical formation of an oxide, specifically with a wet-chemical process that oxidizes the silicon substrate 5 which is uncovered in the trench.

Figure 3:
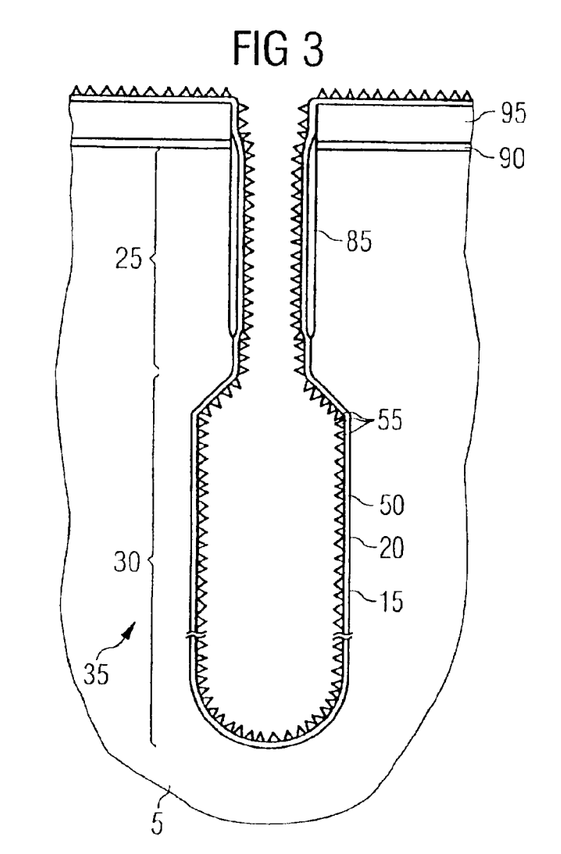
FIG. 3 is the sectional view from FIG. 2, wherein nanocrystallites have been deposited in the trench.

Referring now to FIG. 3, a nonselective deposit of HSG (hemispherical silicon grains) is deposited on the stop layer 50. In the process, individual nanocrystallites 55 are formed on the stop layer 50. The process parameters for the deposition of the HSG are selected in such a way that a multiplicity of crystallization seeds commence crystal growth on the stop layer 50, resulting in the formation of the multiplicity of nanocrystallites 55 in the trench 15. The nanocrystallites are formed both on the substrate 5, in the upper region 25 and in the lower region 30 of the trench 15. In FIG. 3, the stop layer has been deposited, for example, by means of CVD and is also arranged on the insulation collar 85. If the stop layer 50, as shown in FIG. 2, has been formed only in the lower region of the trench 15, the HSG is formed on the stop layer 50 and the insulation collar.

Figure 4:
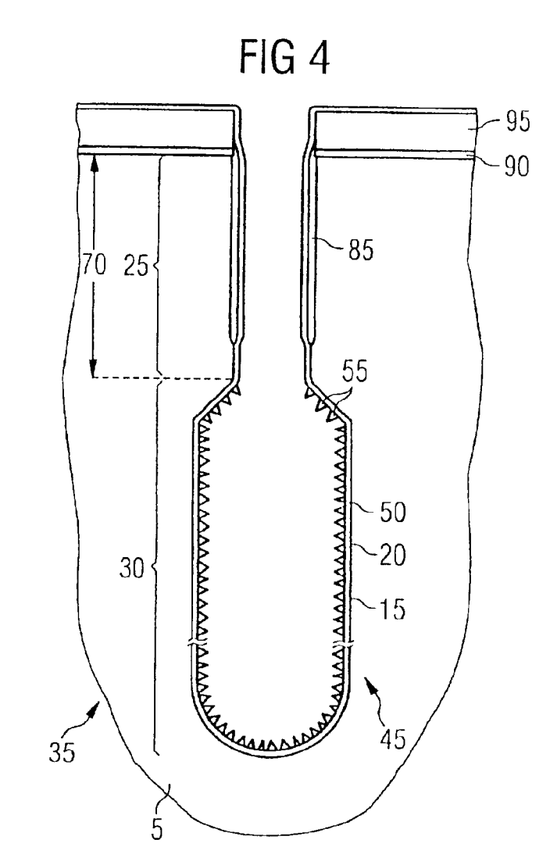
FIG. 4 is the sectional view from FIG. 3, wherein the nanocrystallites have been removed from the upper region of the trench.

With reference to FIG. 4, an etching depth 70 is selected, and the process parameters for a subsequent etch are set in such a way that the nanocrystallites 55 are removed from the upper region 25 of the trench 15 and remain in place in the lower region 30. In this context, it is worth noting that neither the nanocrystallites 55 in the upper region 25 nor the nanocrystallites 55 in the lower region 30 of the trench 15 are protected with a mask. Sulfur hexafluoride and nitrogen are used as etching gases for the etch. The gas flow rate for sulfur hexafluoride is set to between 10 sccm and 100 sccm, and the nitrogen gas flow rate is set to between 50 sccm and 100 sccm. A gas flow rate of 30 sccm of sulfur hexafluoride and 70 sccm of nitrogen has proven particularly advantageous. The gases are introduced into an etching chamber in order to carry out a dry-etching process. Furthermore, a pressure of between 30 and 50 millitorr, preferably 40 millitorr, is set in the process chamber. It has proven particularly advantageous if the ratio of the gas flow rates of sulfur hexafluoride to nitrogen is selected to be between 0.1 and 1.

In addition, chlorine may optionally be introduced into the process chamber, wherein case a gas flow rate of between 0 sccm and 90 sccm is suitable. A chlorine gas flow rate of 40 sccm has proven particularly advantageous.

The etch is preferably carried out with a very low DC bias, with directional acceleration of ions perpendicular to the substrate surface being avoided. The temperature of the etching-chamber wall is set, for example, to 20° C. and the temperature of the substrate 5 is set, for example, to 65° C. The power which is introduced in order to generate the plasma in the etching chamber is selected to be between 100 watts and 400 watts, preferably to be 250 watts. The etching depth 70 down to which the nanocrystallites 55 are removed from the upper region 25 of the trench 15 is mainly dependent, for example, on the ratio of sulfur hexafluoride to nitrogen and on the time for which the etch is carried out. The etching time is typically between 10 and 60 seconds.

In an exemplary implementation of the invention, where the etching process was carried out in an etching chamber of the CENTURA® series of Applied Materials, Inc., good results were achieved after an etching time of approximately 20 seconds with the parameter settings described above. The etching time may, if appropriate, need to be adapted, inter alia, as a function of the thickness of the layer that is to be etched and of the critical feature size. The optimum etching time can be determined experimentally by etching test wafers for different lengths of time and then testing the etched wafer with regard to the quality of the layer removed, in order to determine the optimum etching time from this information.

Vapor-phase doping of the HSG and/or the nanocrystallites 55 is then carried out. In the process, a buried strap as outer capacitor electrode 45 is formed in the substrate 5 around the lower region 30 of the trench 15.

Figure 5:
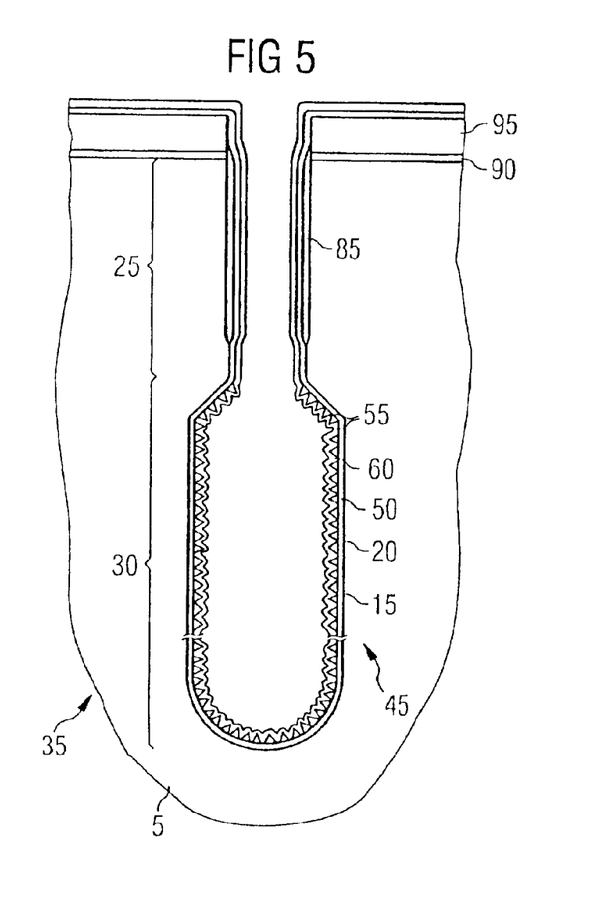
FIG. 5 is the sectional view from FIG. 4, wherein a capacitor dielectric has been introduced into the trench.

Then, referring now to FIG. 5, a capacitor dielectric 60 is formed at least in the lower region 30 of the trench 15. The deposited nanocrystallites, together with a doping which can be introduced into the substrate, form the outer capacitor electrode 45. The capacitor dielectric 60 is optionally also formed on the nanocrystallites 55 and on the collar 85 and on the nitride mask 95.

Figure 6:
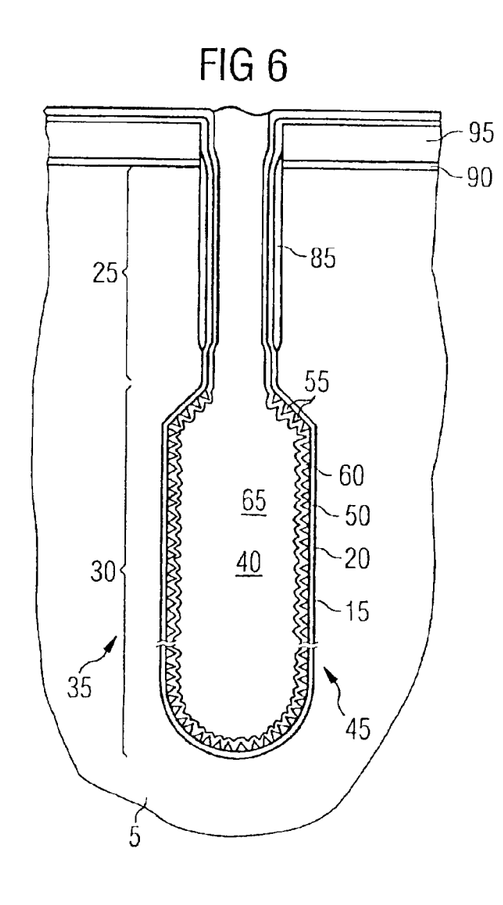
FIG. 6 is the sectional view from FIG. 5, wherein a conductive trench filling has been introduced into the trench as inner capacitor electrode and has been etched back.

Then, referring now to FIG. 6, a conductive trench filling 65 is introduced into the trench 15, on top of the capacitor dielectric 60. The conductive trench filling 65 forms, by way of example, the inner capacitor electrode 40.

Figure 7:
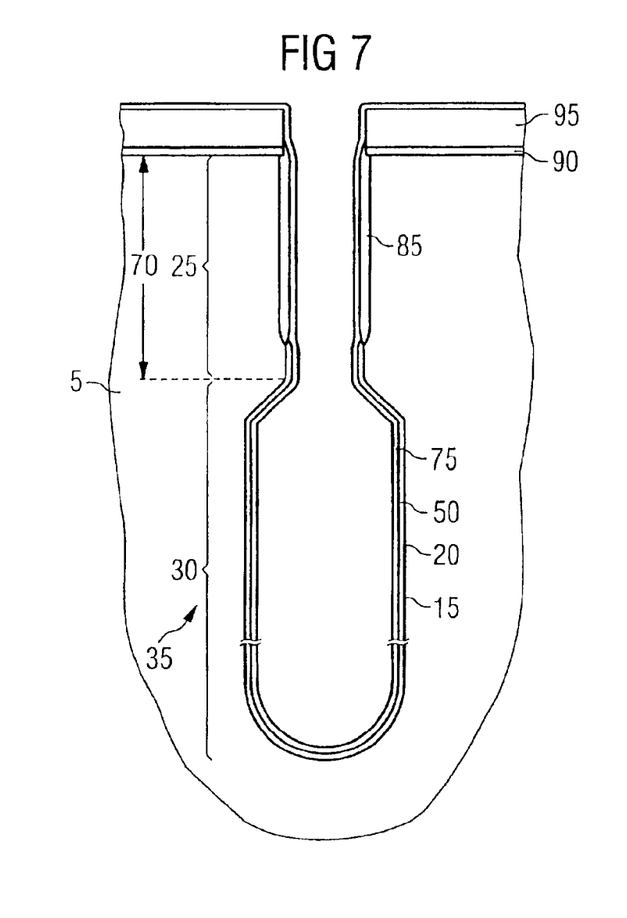
FIG. 7 is a partial sectional view that follows FIG. 2 in the process sequence and wherein a seed layer has been formed on the stop layer in the trench.

With reference to FIG. 7, a description will be given of a second process variant, which follows on from the processing stage illustrated in FIG. 2. A seed layer 75 is deposited on the stop layer 50. The seed layer 75 is typically formed with a thickness of between 5 nm and 10 nm, comprises, by way of example, an amorphous silicon layer, and may be formed by CVD (chemical vapor deposition). Alternatively, the stop layer 50—as shown in FIG. 7—may be formed only in the lower region 30 of the trench 15, so that the seed layer is formed on the insulation collar 85 in the upper region 25.

Figure 8:
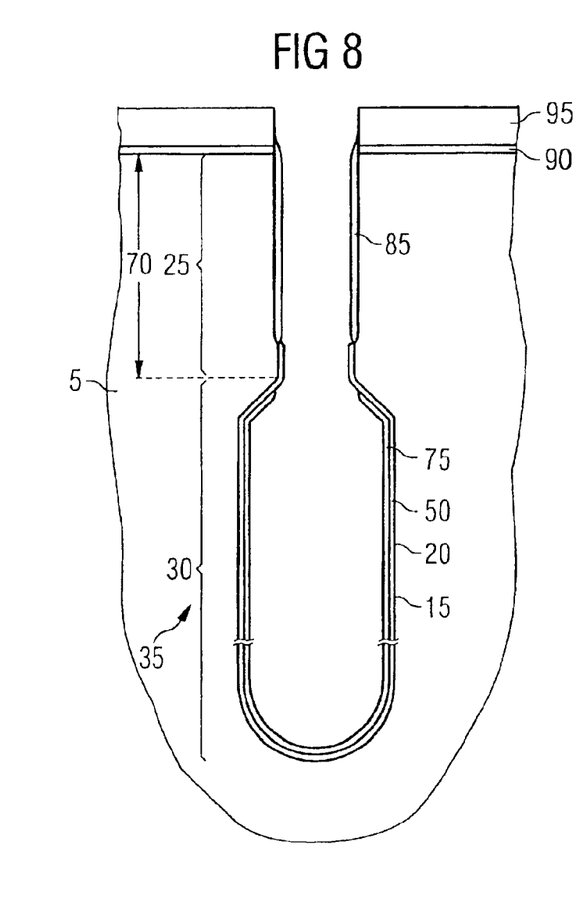
FIG. 8 is the sectional view from FIG. 7, wherein the seed layer has been removed from the upper region of the trench.

Referring now to FIG. 8, the etching process which has already been described in connection with FIG. 4 is carried out. Unlike in FIG. 4, in FIG. 8 no nanocrystallites 55 are removed from the upper region 25 of the trench 15, but rather it is the seed layer 75 which is removed. Then, the stop layer 50 is uncovered in the upper region 25 and the seed layer 75 is uncovered in the lower region 30. The etching depth 70 down to which the seed layer 75 is removed from the upper region 25 of the trench 15 is in turn determined by a suitable selection of the process parameters for the dry-etching process.

Figure 9:
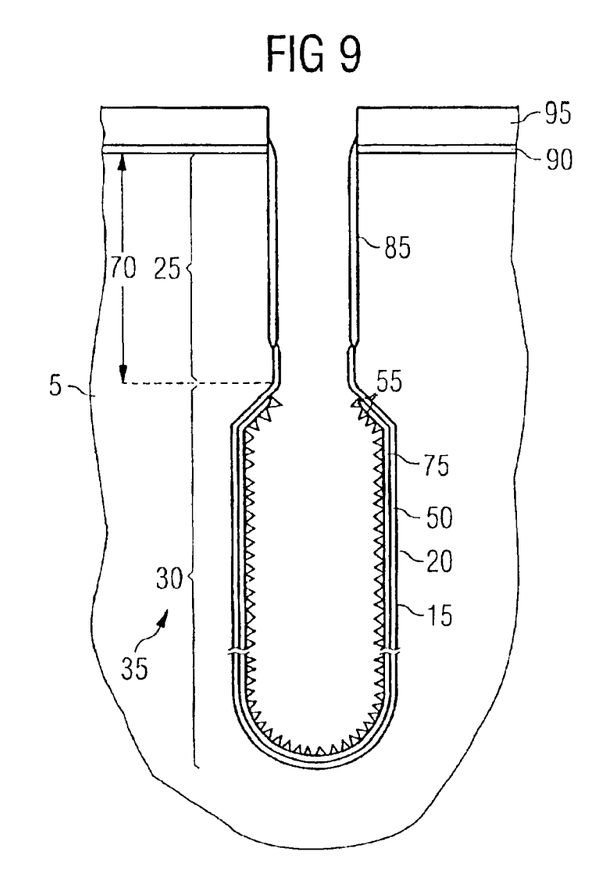
FIG. 9 is the sectional view from FIG. 8, wherein nanocrystallites have grown onto the seed layer in the lower region of the trench.

Then, referring now to FIG. 9, selective deposition of HSG is carried out. The deposition is selective, since the nanocrystallites 55 which are deposited are formed only on the seed layer 75 but not on the stop layer 50. Since the stop layer 50 is uncovered in the upper region 25, scarcely any nanocrystallites 55 are formed in the upper region 25. Instead, the nanocrystallites 55 are formed on the seed layer 75 in the lower region 30 of the trench 15. Vapor-phase doping of the HSG can then be carried out, a buried strap additionally being formed in the lower region 30 of the trench 15 as outer capacitor electrode 45 in the substrate 5.

The selective deposition of the HSG on the seed layer 75 is optionally carried out at elevated temperature, wherein case the seed layer 75 reacts with the deposited HSG during the deposition and thereby contributes to the growth of the HSG crystallites.

Figure 10:
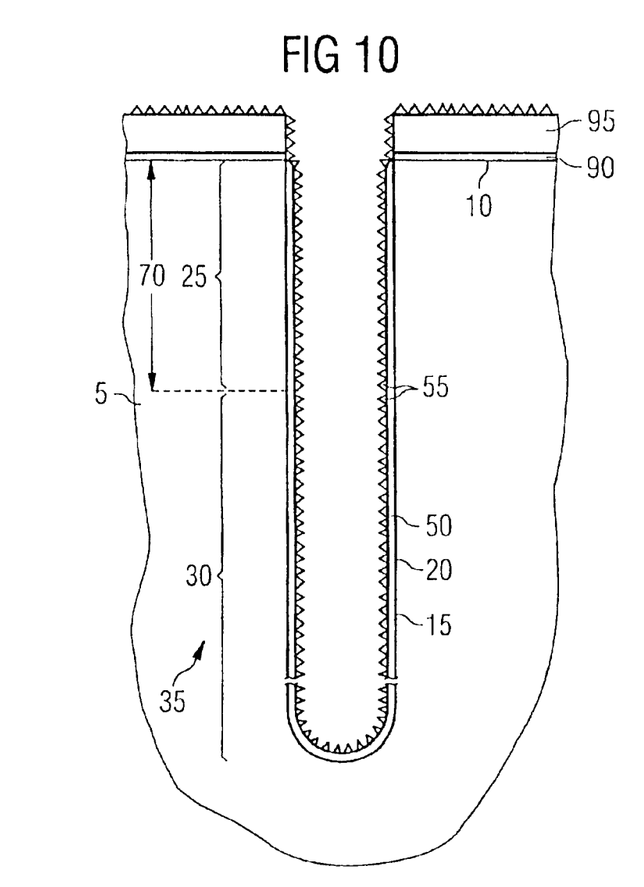
FIG. 10 is a further partial sectional view taken through a trench which, unlike the trench shown in FIG. 1, is not of bottle-shaped design and does not yet have an insulation collar, in the upper region of the collar, a stop layer, on which nanocrystallites have grown, having been formed on the sidewall of the trench.

A further process variant of the method according to the invention will be explained with reference to FIG. 10. A trench 15 is arranged in the substrate 5, which has a substrate surface 10. Unlike in FIG. 1, the trench 15 shown in FIG. 10 is not bottle-shaped and does not yet have an insulation collar 85 in its upper region 25. The stop layer 50 is formed in the trench 15 on the trench sidewall 20. The stop layer 50 consists, for example, of silicon nitride or silicon oxide.

The methods explained in connection with FIG. 2 are suitable for deposition of the stop layer 50. Non-selective deposition of HSG on the stop layer 50 is then carried out. In the process, nanocrystallites 55 are formed on the stop layer 50 in the trench 15.

Figure 11:
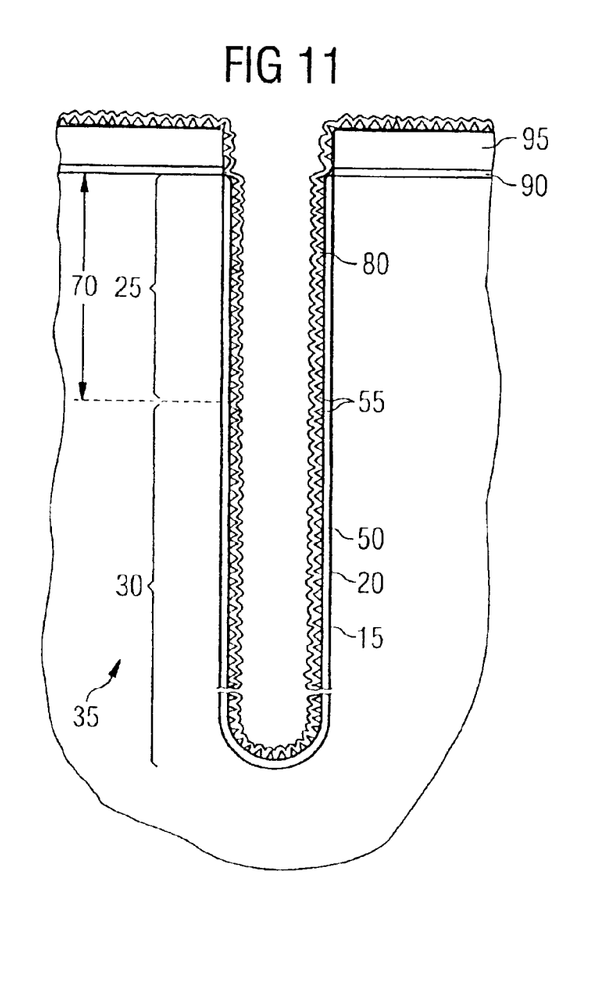
FIG. 11 is the sectional view from FIG. 10, wherein an amorphous layer has grown onto the nanocrystallites.

Then, referring now to FIG. 11, an amorphous layer 80 is deposited in the trench 15, on the uncovered stop layer 50 and the nanocrystallites 55. During a subsequent heating of the substrate, the amorphous layer 80, which consists, for example, of silicon and has a thickness of between 5 nm and 10 nm, reacts with the nanocrystallites 55, during which reaction recrystallization which takes place modifies the size and structure of the nanocrystallites 55 in an advantageous way such that an improved trench capacitor 35 is formed.

The amorphous layer 80 may optionally also follow on from the process sequence from FIG. 4 and FIG. 9, in order in those cases too to improve the shape and size of the nanocrystallites 55 in an advantageous way.

Figure 12:
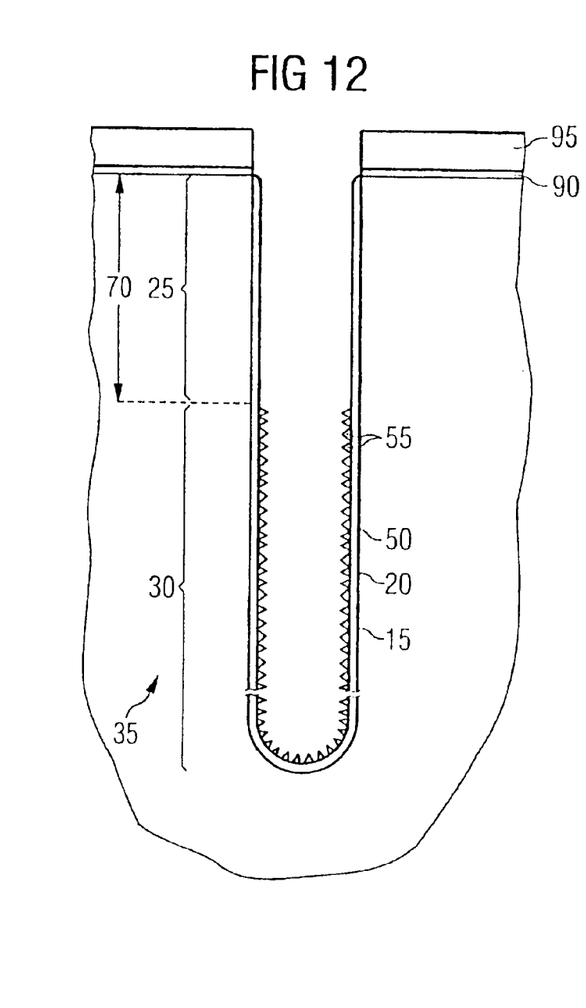
FIG. 12 is the sectional view from FIG. 11, wherein the nanocrystallites have recrystallized with the amorphous layer by means of a temperature increase, and the nanocrystallites have been removed from the upper region of the trench.

Referring now to FIG. 12, the etching method according to the invention is carried out, during which the nanocrystallites 55 are removed from the upper region 25 of the trench 15. Once again, in this etching method no etching mask is used to cover the nanocrystallites in the lower region 30 of the trench 15. Then, a capacitor dielectric 60 and an insulation collar 85, as well as the inner capacitor electrode 40 and the doping of the outer capacitor electrode 45, are formed.

We claim:

1. A method for fabricating a trench capacitor having an inner capacitor electrode and an outer capacitor electrode, which comprises the following method steps:

providing a substrate having a substrate surface and a trench formed therein, the trench having a trench sidewall, an upper region proximal to the substrate surface and a lower region distal from the substrate surface;

forming a stop layer on the trench sidewall;

depositing nanocrystallites on the stop layer to form a part of the outer capacitor electrode;

subjecting the nanocrystallites to a dry-etching process, with the nanocrystallites exposed in the upper region and in the lower region of the trench, to partly remove the nanocrystallites from the trench, and thereby setting parameters for the dry-etching process causing the nanocrystallites to be removed from the upper region of the trench but to remain in place in the lower region of the trench, the dry-etching process including etching with sulfur hexafluoride and nitrogen as etching gases; and subsequently forming a capacitor dielectric in the trench; and at least partially filling the trench with a conductive trench filling forming the inner capacitor electrode.

2. The method according to claim 1, which comprises forming the stop layer on the sidewall in the lower region and in the upper region of the trench.

3. The method according to claim 1, which comprises setting an etching time of the dry-etching process as a parameter.

4. The method according to claim 1, which comprises stopping the etching process at the stop layer to protect the trench sidewall.

5. The method according to claim 1, which comprises depositing an amorphous layer on the nanocrystallites.

6. The method according to claim 1, wherein the dry-etching process comprises etching at a pressure of between 3.9 Pa and 6.8 Pa in the etching chamber.

7. The method according to claim 1, which comprises forming an insulation collar on the trench sidewall in the upper region.

8. The method according to claim 1, wherein the dry-etching process comprises introducing a power of between 100 W and 400 W into a process chamber during the etching process.

9. The method according to claim 1, wherein the dry-etching process comprises etching for a time of between 5 seconds and 300 seconds.

10. A method of fabricating a trench capacitor having an inner capacitor electrode and an outer capacitor electrode, which comprises the following method steps:

providing a substrate having a substrate surface and a trench formed therein, the trench having a trench sidewall, an upper region proximal to the substrate surface and a lower region distal from the substrate surface;

forming a stop layer on the trench sidewall;

forming a seed layer on the stop layer in the lower region and in the upper region of the trench;

subjecting the seed layer to a dry-etching process, while the seed layer is exposed in the upper region and in the lower region, to partly remove the layer from the trench, and thereby setting the parameters for the dry-etching process such that the seed layer is removed from the upper region of the trench but remains in place in the lower region of the trench;

selectively depositing a layer of nanocrystallites, to form a part of the outer capacitor electrode;

forming a capacitor dielectric in the trench; and at least partially filling the trench with a conductive trench filling to form the inner capacitor electrode.

11. The method according to claim 10, wherein the depositing step comprises forming the nanocrystallites on the seed layer in the lower region of the trench.

12. The method according to claim 10, which comprises forming the stop layer in the lower region and the upper region of the trench.

13. The method according to claim 10, which comprises stopping the etching process at the stop layer to protect the trench sidewall.

14. The method according to claim 10, which comprises depositing an amorphous layer on the nanocrystallites.

15. The method according to claim 10, wherein the dry-etching process comprises etching with sulfur hexafluoride and nitrogen as etching gases, and setting a gas-flow rate ratio of sulfur hexafluoride to nitrogen at between 0.1 and 1.

16. The method according to claim 10, wherein the dry-etching process comprises etching at a pressure of between 3.9 Pa and 6.8 Pa in the etching chamber.

17. The method according to claim 10, which comprises forming an insulation collar on the trench sidewall in the upper region.

18. The method according to claim 10, wherein the dry-etching process comprises introducing a power of between 100 W and 400 W into a process chamber during the etching process.

19. The method according to claim 10, wherein the dry-etching process comprises etching for a time of between 5 seconds and 300 seconds.

20. The method according to claim 1, wherein the dry-ecthing process comprises setting a gas-flow rate ratio of sulfur hexafluoride to nitrogen at between 0.1 and 1.

* * * * *